(12) United States Patent
Martinelli et al.

(10) Patent No.: US 7,649,791 B2
(45) Date of Patent: Jan. 19, 2010

(54) NON VOLATILE MEMORY DEVICE ARCHITECTURE AND CORRESPONDING PROGRAMMING METHOD

(76) Inventors: Andrea Martinelli, Via XXIV Maggio, 2, I-24025 Gazzariga (BC) (IT); Pierguido Garofalo, Via Gramscl, 6, I-20097 San Donato Milanese (MI) (IT); Graziano Mirichigni, Via XXV Luglio, 13, I-64047 Pietracamela (TE) (IT)

( * ) Notice: Subject to any disclaimer, the term of this patent is extended or adjusted under 35 U.S.C. 154(b) by 329 days.

(21) Appl. No.: 11/713,081

(22) Filed: Feb. 28, 2007

(65) Prior Publication Data

US 2007/0274141 A1 Nov. 29, 2007

(30) Foreign Application Priority Data

Mar. 28, 2006 (IT) .......................... MI2006A0585
Mar. 31, 2006 (IT) .......................... MI2006A0627

(51) Int. Cl.
*G11C 11/00* (2006.01)

(52) U.S. Cl. .................................. 365/205; 365/230.06

(58) Field of Classification Search ............ 365/230.06, 365/205

See application file for complete search history.

(56) References Cited

U.S. PATENT DOCUMENTS

| 5,765,184 | A  | * | 6/1998 | Durante ...................... 711/103 |
| 5,880,988 | A  | * | 3/1999 | Bertin et al. .................. 365/63 |
| 6,285,593 | B1 | * | 9/2001 | Wong .................... 365/185.23 |
| 7,257,039 | B2 | * | 8/2007 | Bedeschi et al. ............ 365/203 |
| 2004/0088470 | A1 | | 5/2004 | Kawamura et al. |
| 2004/0188714 | A1 | | 9/2004 | Scheuerlein et al. |
| 2005/0052999 | A1 | | 3/2005 | Oliver et al. |
| 2005/0141282 | A1 | | 6/2005 | Abedifard et al. |
| 2006/0083078 | A1 | | 4/2006 | Sforzin et al. |

* cited by examiner

*Primary Examiner*—Michael T Tran
(74) *Attorney, Agent, or Firm*—Trop, Pruner & Hu, P.C.

(57) ABSTRACT

A non volatile memory device architecture, suitable for speeding up and synchronize the programming steps of the cells in particular of the Flash-Nor type, of the type comprising a matrix of memory cells organized into rows and columns, at least one group of these columns being selected by at least one first enable signal by a second enable signal generated by a first decoder; the group of columns being associated with at least one Program Load PL controlled by a logic circuit comprising a first centralized portion and plural second portions associated with a respective program load sequentially updated and driven in a synchronous way to the first centralized portion.

19 Claims, 3 Drawing Sheets

NON VOLATILE MEMORY DEVICE ARCHITECTURE AND CORRESPONDING PROGRAMMING METHOD

PRIORITY CLAIM

This application claims priority from Italian patent applications No. MI2006A000627, filed Mar. 31, 2006 and No. MI2006A000585, filed Mar. 28, 2006, which are incorporated herein by reference.

CROSS REFERENCE TO RELATED APPLICATION

This application is related to U.S. patent application Ser. No. 11/713,074 entitled ELECTRONIC DEVICE COMPRISING NON VOLATILE MEMORY CELLS WITH OPTIMIZED PROGRAMMING AND CORRESPONDING PROGRAMMING METHOD, which has a common filing date and owner and which is incorporated by reference.

TECHNICAL FIELD

The present invention relates generally to an architecture of a non-volatile memory device, in particular of the Flash-Nor type.

More in particular an embodiment of the invention relates to a memory device comprising a matrix of memory cells organized in rows or Word-lines and columns or Bit-lines, at least one group of these columns being selected by a first enable signal and by at least one second enable signal generated by a first decoder; the at least one group being associated with a program load controlled by a logic circuit and suitable for applying a programming pulse to at least one cell comprises in a respective activated column of the group, the logic circuit comprising a first input centralized portion for the matrix and plural second output portions each specific for each Program Load and communicating with the first portion by means of a bidirectional bus.

Another embodiment of the invention further relates to a method for programming a non-volatile memory device.

BACKGROUND

As it is well known, the diffused use of multimedia applications and the expansion of these applications require a management of a greater and greater amount of data to be stored in the shortest time possible.

To fulfill this request non volatile memory devices are currently used, with memory structures for example of the Flash-Nor type, which show, in fact, the peculiarity of managing a big number of data, storing them quickly.

The architectures of the memory devices currently used comprise memory cells matrixes organized in rows or Word-lines intersected by columns or Bit-lines, each matrix being divided for example into partitions, which comprise a plurality of sectors, with each sector comprising a group of cells. The groups are adjacent to each other and each comprises a predetermined number of Word-lines and Bit-lines of cells.

In each matrix of memory cells, according to the metal arrangements present in the matrix itself, a group comprising a predetermined number of columns is selected by a plurality of first enable signals and by at least one further plurality of second enable signals in relation to the number of metals present.

A main advantage of the Flash-Nor memories resides in that a programming operation of the cells of a group of columns is managed, as a whole, inside the device, i.e. it occurs sequentially for all the cells belonging to the columns of the group according to a specific decoding.

FIG. 1 shows a programming method of a group of columns of a Flash-Nor memory device by means of a flow chart.

The programming method provides a programming cycle defined by a repetition of programming steps D and control steps C until all the memory cells of the group have reached a desired threshold.

The control steps C of the method comprise a verify step 1 "pumps in verify conditions" in which a plurality of pumps verify the content of the cells belonging to the columns of the group being programming, and operates by means of a cyclic step 2 "verify loop" analyzing, in sequence, all the cells of the columns.

The control steps C also comprise a comparison step 3, indicated as "pattern", which allows to check if each cell of each column has reached a desired threshold. If the comparison step 3 gives a positive result (YES) the method ends (END) and a correct programming of all the cells of the group has occurred.

In case of negative result (NO) of the comparison step 3, the method provides a second comparison step 4, indicated in the flow chart as "over programmed", which verifies the cells of the group by controlling that they are not over-programmed. If the step of second comparison 4 gives a positive result (YES) the method ends (END) and a programming error 9, "Fail program error", is emitted, suitable for defining a failure of the programming.

Instead, in case of negative result (NO) of the step of second comparison 4 the cells of the group that during the verify step 1 have not reached the desired threshold, but that are however cells to be programmed, are subjected to the programming steps D.

The programming steps D comprise a pulse application step 5 during which a pulses sequence, of defined maximum voltage, is generated by a plurality of "pumps in pgm conditions" and applied to the cells of the group to be programmed by means of a second cyclic step 6 "pulse loop".

The programming steps D of the method thus comprise a step of voltage increase 7, by means of a circuit "DAC Increment & Store", which defines an increase of the voltage to be used in a successive pulses sequence.

A successive overflow verify step 8, "Dac overflow", if positive (YES), ends the method (END) and a programming error 9 is generated for signaling a failure of the programming of the cells of the group.

If instead the overflow verify step 8 is negative (NO), the cells of the group are subjected to a new programming cycle and the above described method steps, of control C and of programming D, are repeated.

As highlighted, the programming method of a group of cells ends with the programming of all the memory cells according to a desired threshold, or the method ends with a failure of the programming when two possible events occur:
- the pulses sequence reaches a maximum value of acceptable voltage, without however the cells of the group reach the desired threshold;
- one or more cells of the group are over-programmed.

The annexed FIG. 2 schematically and partially shows a device 11 of the known type with an architecture suitable for realizing in particular the cyclic application step 6 of the above described programming step D.

It is good to note that these devices 11 show a particularly long passage time of the voltages from the programming step to the verify step, then, for trying to decrease the number of voltage switches, increasing the performances, each programming step between two successive verify steps, is carried out passing all the cells of the columns of the group. In this way, a pulses sequence for each programming step will comprise a number of pulses equal to the ratio between the number of cells of the group and a maximum parallelism allowed by the device 11.

In the present treatment reference will be made, in a specific way, to a "programming per row", i.e., a programming which provides to sequentially select and to program cells belonging to a same row or word line WL.

In particular then, for each group to be programmed, the cells under programming belong to a same row or word-line WL, selected in the usual way, and to columns sequentially selected by means of suitable select signals YN, Y0 generated by a decoder 12.

A currently used non volatile memory device architecture is shown in FIG. 2. The architecture shows a group 11 to be programmed which comprises a group of columns, of a matrix of memory cells, associated with a respective logic circuit 30. The logic circuit 30 is a portion of a global circuit structure associated with the entire matrix for the management of the programming of the cells.

Each logic circuit 30 comprises a High Voltage circuit HV connected to a P_pulse signal for the control of a program load PL which allows to carry out a pulse programming of suitable selected cells.

In the embodiment shown, a matrix of cells is considered with a number of metallizations equal to three, and in particular, a first level M1, lower, and a level M3 where respectively a plurality of columns or local bit-lines LBL and a plurality of global bit-lines GBL are defined, and a second level M2 where the rows or word-lines WL are defined.

In the example of FIG. 2, the global bit-lines GBL of the group to be programmed 11 are shown in the number of eight GBLi i=0, . . . 7 and the local bit-lines LBLij are 32 connected in groups of four, consecutive, to a global bit-line GBLi.

The global bit-lines GBLi i=0, . . . 7 are enabled by means of a first select signal YNi, generated by the decoder 12, which activates a corresponding first enable transistor Tg g=0, . . . 7 interposed between each global bit-line GBLi i=0, . . . 7 and a control line Lc shared by all the global bit lines GBLi.

For each global bit-line GBLi i=0, . . . 7 corresponding to the local bit-lines LBLij j=0 . . . 3 are enabled by a same second select signal YOj j=0 . . . 3, generated by the decoder 12, which activates a corresponding second enable transistor Tij i=0, . . . 7 j=0, . . . 3 interposed between each local bit-line LBLij and the corresponding global bit line GBLi.

It is good to note then how, in the present embodiment, a switch of the second select signal YOj occurs after a complete switch of the first signal YNi.

In the embodiment shown, the cells of the matrix are of the two bits per cell type. Similar considerations can be carried out for matrixes with multilevel cells.

The group to be programmed 11 further comprises a discharge circuit 33 with a discharge transistor 34 interposed between the control line Lc and a ground reference. A discharge signal YNS_DISCH controls the discharge transistor 34 and allows to discharge possible high voltages on a selected column at the end of the application of the programming pulse on the local bit-line LBLij which comprises the programmed cell.

The group 11 to be programmed also comprises a Sense Amplifiers SA which, suitably controlled, allows to read the programmed cells of the sector 10.

It is good to note that an architecture of these groups 11 to be programmed allows a programming parallelism which depends on the number of program loads PL, moreover, if these program loads PL are equal to the number of Sense Amplifiers SA, the same number of cells can be programmed and read simultaneously.

The logic 32 of the logic circuit 30 comprises a plurality of latches registers LT, which store the evolution of the programming of each successive cell at each programming pulse.

In the example shown, with the cells storing two bits, each cell is connected with a couple of latches registers LT and the cell is programmed only if both the latches registers LT reach desired values. Each couple of latches registers LT, relative to a cell, is connected to a combinatory network RC which has an output Up relative to the programming state of the cell itself: to be programmed or not to be programmed.

The number of couples of latches registers LT and thus the number of outputs Up is equal to the number of the cells contained in the group, i.e., Up p=0, . . . N.

The outputs Up p=0. . . N of the combinatory networks RC are connected to a multiplexer 17 and are tested, during each programming step, on the basis of an address signal ADD_WB, supplied by the decoder 21.

The outputs Up are, in a sequential way, brought to an output O1 of the multiplexer 17 and suitably control the circuitry High Voltage 31 and thus the program load PL.

The described device, although satisfactory under several points of view, shows however some drawbacks, in fact, each program load PL programs a defined group of columns and it is necessary to repeat the logic circuit 30 for each program load PL. This architecture is expensive in terms of area occupied by the device.

Moreover, in the devices with architecture of the so called multibanking type, wherein simultaneously there is the programming of a group of cells belonging to a partition and the reading of a group of cells belonging to another partition, the expense of occupied area is even greater.

In fact, in these devices, it is often avoided that the lines transporting high voltages, i.e., the programming voltages, often very noisy, interfere with circuits arranged for the reading of the cells themselves that, through interference, could modify the read value. Then, for avoiding these interferences between cells belonging to bit lines under programming and reading, it is necessary to dedicate, to each partition, all the high voltage circuitry necessary for reading and for programming a cell, in particular the program load PL. This implies a remarkable increase of the occupied area.

A further device of the known type which, in part, solves the above cited drawbacks, is schematically shown in FIG. 3.

The device shows an architecture similar to the previously described one, with a group 40 to be programmed which comprises a portion of a matrix of memory cells structured in rows WL and columns BL associated with a column decoder 21 suitable for selectively activating a column of the group.

The decoder 21 generates a first enable signal YNi, which sequentially activates a group of global bit lines GBLi, which, in the present example, are in the number of eight i=0, . . . , 7, and a second enable signal YOj which activates a determined associated local bit line LBLj. The local bit lines LBLij in the present example are in the number of four. Each first enable signal YNi i=0, . . . , 7 controls a respective access transistor Ti i=0, . . . , 7 connected between each global bit line GBLi i=0, . . . , 7 and a program load PL, shared by all the columns GBLi i=0, . . . , 7 of the group.

Also in this example the programming occurs per "row" and then the switch of the second select signals YOj occurs after the complete switch of the first select signals YNi.

Also in this embodiment the cells are of the two bit per cell type, similar considerations can be made for multilevel cells.

The group 40 to be programmed also comprises a discharge circuit 33 with a discharge transistor 34, interposed between each global bit line GBLi and a ground reference, controlled by a suitable discharge signal YNS_DISCH which allows to discharge possible high voltages present on each column of the group selected at the end of the application of the programming pulses sequence.

The second device shows a second circuit 45 suitable for controlling the program load PL for a pulses programming of the cell of the selected column of the group.

In the present embodiment, the second circuit 45 comprises a circuit portion 43, unique for the entire matrix, associated by means of a bus Data_bus with plural second portions 44 one for each program load PL, i.e., for each group 40 to be programmed.

Then bidirectional bus Data_bus circulates on the whole device.

The central portion 43 comprises a plurality of couples of Latches registers LT which store the evolution of the programming of the cells, successive to each programming pulses sequence.

Each couple of latches registers LT, relative to a cell, is connected to a combinatory network RC which has an output Up p=0, ..., N which detects the programming state of the cell itself: to be programmed or not to be programmed.

The outputs Up p=0, ..., N of the combinatory networks RC are connected to a multiplexer 41 and are tested during each programming step, on the basis of an address signal ADD_WB supplied by the decoder 21, and brought in a sequential way to an output O1 of the multiplexer 41.

The multiplexer 41 is connected to a logic gate 42 which is in turn enabled by an update signal Update_pgmloads for the connection by means of the bus Data_bus to a first latch register LTc of the second portion 44 which suitably controls a high Voltage circuitry 31 and then the program load PL.

A programming cycle of the second device is partially shown in FIG. 4 where the waveforms are shown of the signals used during a programming step of two cells of a same selected row WLc and belonging to two global consecutive bit lines alternatively activated by the first select signal YNi, in particular YN3 and YN4. Moreover, these cells to be programmed belong to a local bit line LBLij, associated respectively with the global bit line GBL3 and GBL4, activated by a same second select signal YOj.

The programming provides a select and discharge step H1 where the discharge signal YNS_DISCH is activated, i.e., in the specific case brought to high logic level, by discharging the possible high voltage present in the column with the just programmed cell and, in the specific case, it will be the column activated by the first select signal YN2.

The step H1 provides the deactivation of the discharge signal Yns_disch there is a switch of the first select signal YNi by activating in particular YN3 which activating the transistor enables the global bit-line GBL3.

The programming thus provides with a preparation step H2, updating the first latch register LTc with the information if the selected cell must be programmed or not. In particular, during this step H2 the update signal Update_Pgmloads enables the logic gate 42 with the data transfer, by means of the bus Data_bus, from the output O1 of the multiplexer 41 to the first latch register LTc.

Finally, by means of a storage step H3, an impulsive signal P_PULSE is activated, i.e., brought to a high logic value, and the pulse programming goes on by means of the program loads PL of the cell of the local bit line LBL3j activated by the second select signal YOj and associated with the selected global bit line GBL3.

Subsequently to the storage step H3 it is necessary to arrange a time sufficiently long for discharging the high voltage accumulated on the just pulsed column, bringing the discharge signal YNS_DISCH which enables the discharge transistor 34 of the discharge circuit 33 to a high logic level.

The architecture of the second device allows to reduce the memory area occupied by the second circuit 45, in fact, the second portion 44 is repeated for each program load PL, while the central portion 43, which occupies a greater space in memory, is unique for the whole device.

The second device shown, although meeting the required needs of reducing the occupied area, shows however some drawbacks linked to the duration of the programming cycle, which remains quite high.

In fact, the discharge step H1 needs an execution time in the order of some tens of nanoseconds while the preparation step H2 needs an update time of the program load usually higher than the hundred of nanoseconds, value which depends on the parallelism of the communication bus and on the transfer speed. Then, their contribution-sum is extremely relevant and non negligible already in the presence of a programming pulse of the duration of a microsecond.

SUMMARY

An embodiment of the present invention provides a device architecture which allows to reduce the times of a programming cycle without causing in the meantime a remarkable increase of the occupied memory area and which is able to overcome the limits and the drawback still affecting or limiting the non volatile memory devices of the Flash-Nor type as well as the methods proposed by the prior art.

Another embodiment of the invention provides an architecture of a device able to speed up the data transfer and to synchronize it for plural second portions.

BRIEF DESCRIPTION OF THE DRAWINGS

The characteristics and the advantages of the device and of the method according to the present invention will be apparent from the following description of an embodiment thereof given by way of indicative and non limiting example with reference to the annexed drawings.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
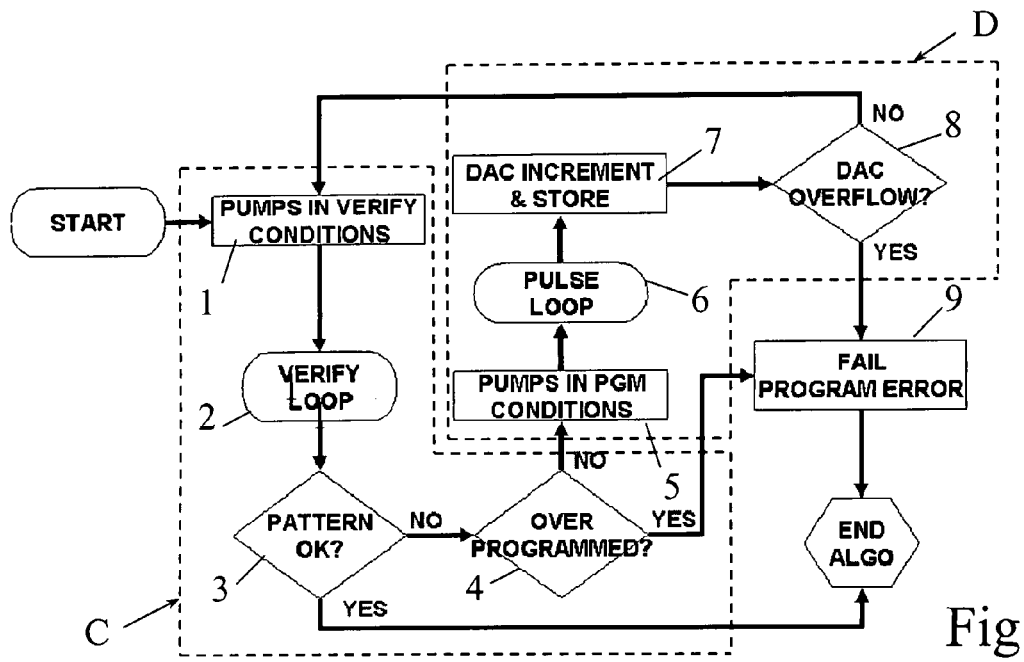
FIG. 1 is a flow chart of a memory device according to the prior art.
Figure 2:
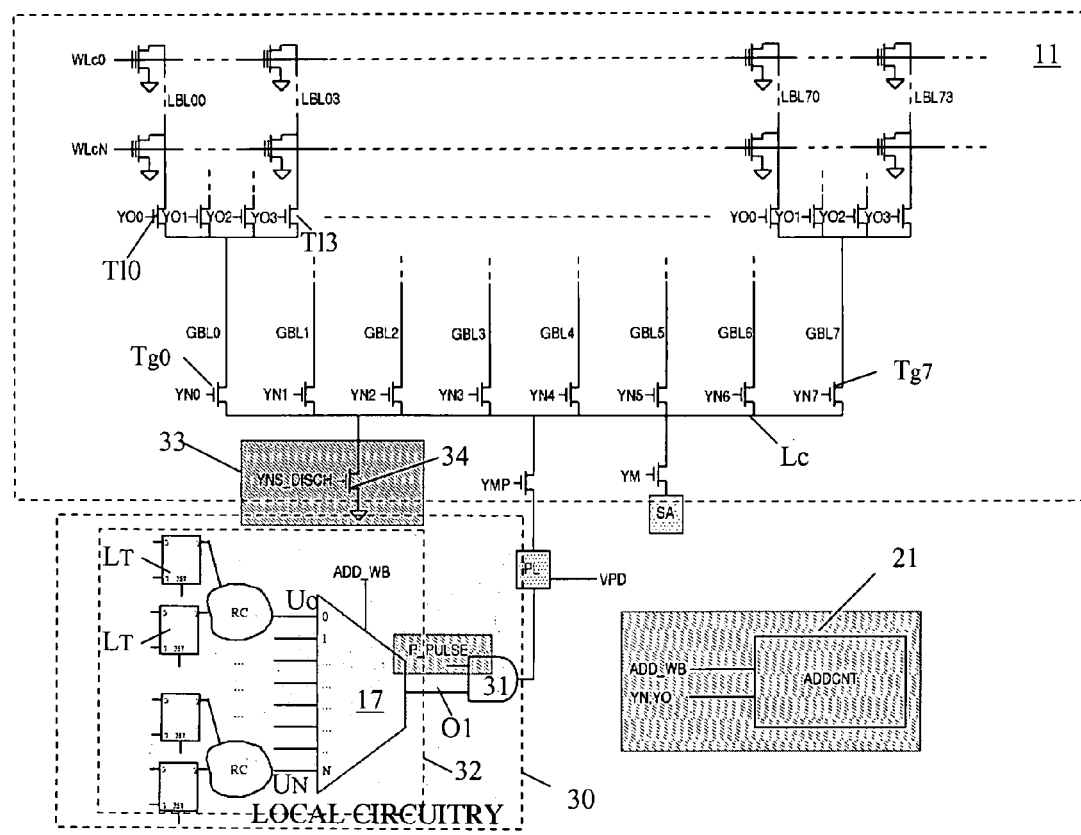
FIGS. 2 and 3 are two memory devices realized according to the prior art.
Figure 3:
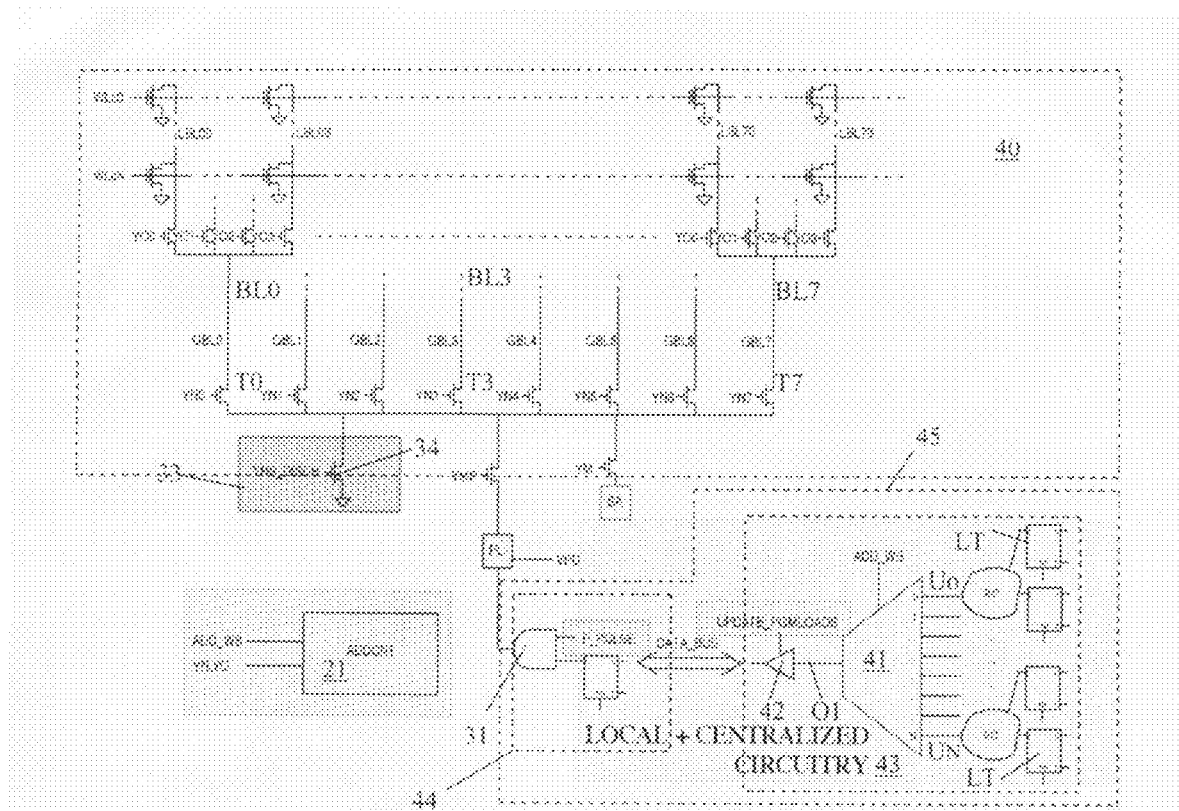
Figure 4:
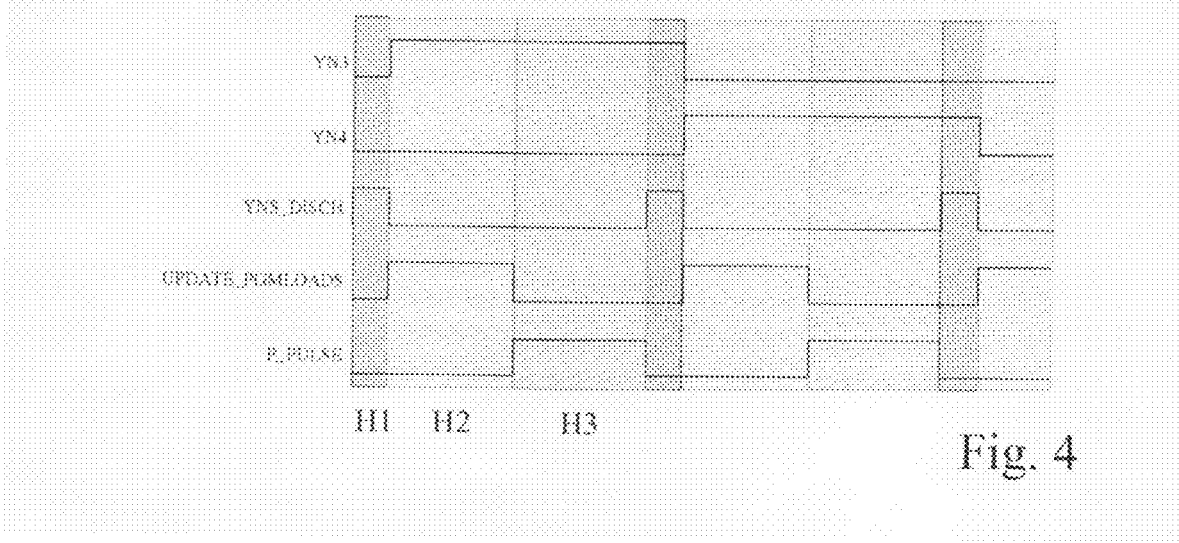
FIG. 4 is a piece of the waveforms generated by the device shown in FIG. 3 during a programming step of two consecutive columns of a group according to a representation not drawn to scale.
Figure 5:
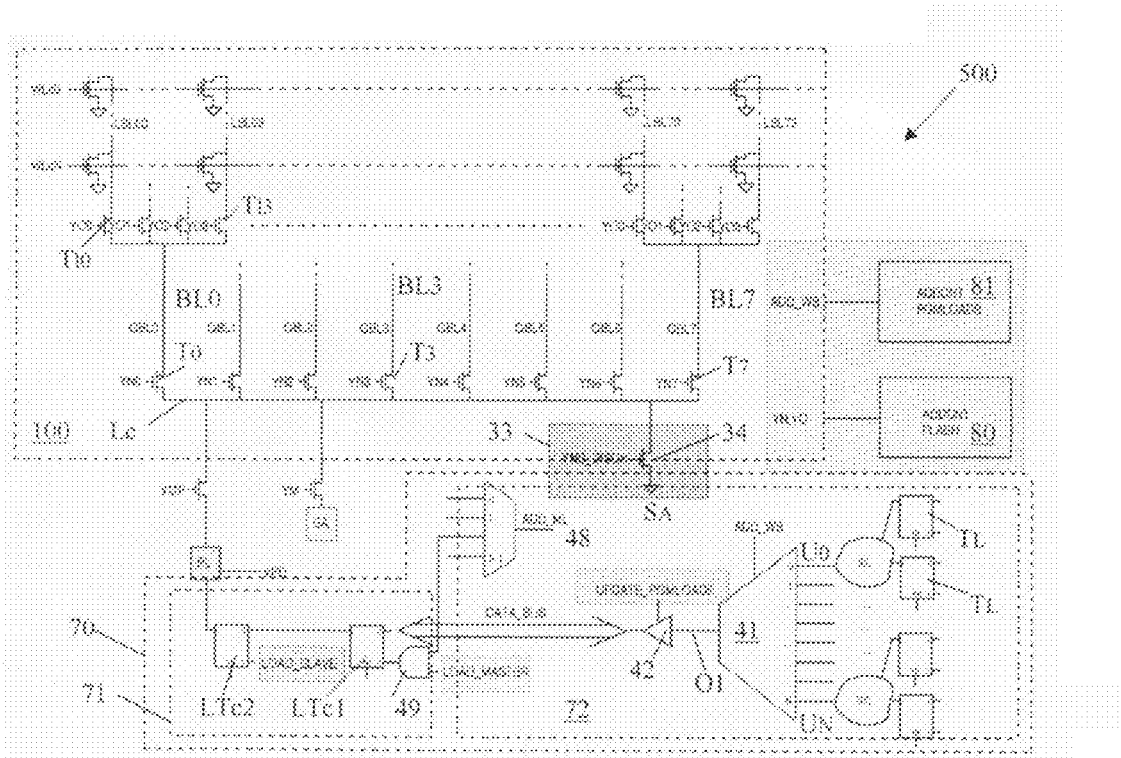
FIG. 5 is a memory device realized according to an embodiment of the present invention.

Referring to these figures and in particular referring to FIG. 5, 500 globally indicates an architecture of a memory device, schematically shown and realized according to an embodiment of the present invention. The architecture comprises a matrix of non volatile memory cells, for example of the Flash-Nor type.

In the following description reference is made to a device with an architecture similar to that of the devices described with reference to the prior art and the same reference numbers will be used as those previously used for identifying details having the same structure and function.

The matrix of Flash-Nor memory cells is organized with a plurality of rows WL, or Word-lines, intersected by a plurality of columns BL, or Bit-lines. The proposed device is based on the consideration that the matrix of cells is divided into a plurality of groups of cells to be programmed, substantially adjacent to each other. A group comprises a predetermined number of columns.

In the example shown in FIG. 5, the group to be programmed is associated with a first column decoder 80, ADDCNT_FLASH, suitable for activating a specific column of the group.

The matrix of cells of the indicated embodiment is obtained with a number of metallization levels equal to three with a first level M1 and a third level M3, suitable for defining a plurality of columns and respectively local bit-lines LBL associated, according to a specific mode, with a plurality of global bit-lines GBL. A second level M2 allows to define the rows or word-lines WL. In other words, the lower metallization level M1 defines the local bit lines LBL, the intermediate level M2 the word lines WL and the higher level M3 the global bit lines GBL.

In particular, in the present example, the global bit-lines GBL are in the number of eight GBLi i=0 ... 7, each associated with four consecutive local bit-lines LBLj j=0 ... 3.

Other similar solutions could provide a device with a matrix realized with a different number of metallizations; in this case a suitable decoder manages a different and corresponding number of enable signals YN, YO.

In the present embodiment, the first decoder 80 generates a first select signal YNi i=0 ... 7 suitable for activating a first enable transistor Ti i=0, ... 7 connected between a corresponding global bit-line GBLi i=0 ... 7 and a control line Lc, shared by all the global bit-lines GBLi.

The decoder 12 generates, moreover, a second select signal YOj j=0 ... 3 suitable for activating a second enable transistor Tij i=0 ... 7, j=0 ... 3 connected between the local bit-lines LBLj j=0, ... 3 and the corresponding global bit-line GBLi i=0 ... 7.

The device architecture according to an embodiment of the present invention also comprises a logic circuit 70 suitable for controlling a Program Load PL for a pulses programming of the cells of the columns of the group. The logic circuit 70 comprises a central portion 72 and a plurality of second portions 71 each suitable for being associated with a program load PL.

The central portion 72 comprises, for the present embodiment shown, in which the memory cells show, by mere way of example, two bits per cell, a plurality of couples of Latches registers LT which store the programming evolution of the cell successive to each programming pulses sequence generated and sent by the Program Load PL.

Each couple of latches registers LT, relative to a cell, is connected to a combinatory network RC which has an output Up p=0, ..., N that detects the programming state of the cell itself: to be programmed or not to be programmed.

The number N of the outputs Up is equal to the number of the bits belonging to the columns of the group divided by the capacity of the DATA_BUS. Each output Up is in fact in turn a bus of data which are sent to corresponding program loads PL of different groups to be programmed. The outputs Up p=0, ..., N of the combinatory networks RC are connected to a multiplexer 41 and are tested in sequence during each programming step.

Advantageously according to an embodiment of the present invention, a second decoder 81 generates a first address signal ADD_WB which conveniently drives the multiplexer 41.

Suitably, the second decoder 81 operates independently from the first decoder 80 and in particular the address signal ADD_WB selects data referred to a group of columns BLi+1 activated by the second select signal YNi+1 successive with respect to the group of columns activates by the second enable signal YNi i=0, ..., 7.

Advantageously, the multiplexer 41 is connected to a logic gate 42 which is enabled by an update signal Update_pgm-loads and in turn connected to the bus Data_bus.

Advantageously according to an embodiment of the present invention, the plural second output portions 71 associated with respective program loads PL are activated in parallel.

Suitably, each second portion 71 comprises a Master-Slave circuit realized by a first latch LTc1, controlled by a first control- signal Comm, connected to a second Latch register Ltc2 in cascade, controlled by a second control signal Load_slave.

The second register LTc2 is connected to the Program Load PL and is connected to the control line Lc, shared by all the columns BLi i=0, ..., 7 of the group.

Suitably, each of the plural second portions 71 and in particular, according to the present embodiment, each first Latch register LTc1 is driven by the first control signal which is a second address signal ADD_ML.

Conveniently, according to a possible solution, the second address signal ADD_ML is generated by the second decoder 81.

In particular, the second address signal ADD_ML is a processing of the first address signal ADD_WB and, in a preferred embodiment, comprises the less significant bits of the first address signal ADD_WB.

Thanks to the present driving, it is thus possible to update a greater amount of plural second portions 71 repeatedly updating the bus Data_bus and sequentially activating corresponding first Latch registers LTc1.

The reduced capacity of the bus Data_bus allows to reduce the amount of area occupied by the device according to an embodiment of the present invention.

Advantageously, then, the central portion 72 comprises a further decoder 48 which carries out a "local" decoding showing at the output in a sequential way the signal at its input corresponding to the second address signal ADD_ML related to the first address signal ADD_WB. Each output of the decoder 48 is connected to a respective first Latch register LTc1 of a second portion 71 by means of a second logic gate 49. The second logic gate 49 shows at a first input an output of the decoder 48 and at a second input a synchronization signal Load_Master for generating at the output the first control signal Comm.

Figure 6:
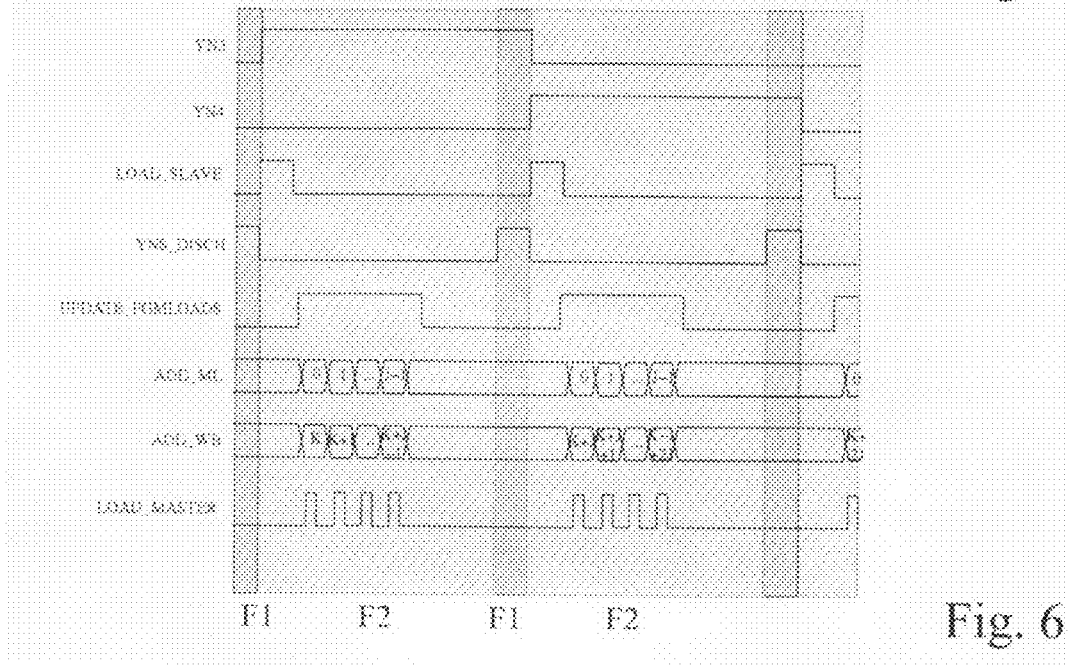
FIG. 6 is a section of waveforms generated by the device of FIG. 5 during a programming step of two consecutive columns of a non volatile memory of the Flash-nor type, according to a representation not drawn to scale.

The operation of the device according to an embodiment of the invention is schematically indicated in FIG. 6 where the waveforms are shown during a programming of two consecutive columns YNi of a plurality of groups to be programmed associated with program loads PL connected to respective second portions 71 updated by a same central portion 72.

In particular, during a first selection step the first decoder 80 selects the columns to be programmed of each group activating respectively the first select signal YNi and the second select signal Y0j.

The first selection step occurs simultaneously for the plurality of groups associated with the same first decoder 80 and in particular for the present embodiment there will be a switch of the second select signal YOj at each complete switch of the first select signal YNi.

The operation then provides to discharge the last pulsed column BL of each group, discharging the possible residual voltages present. This step is indicated in the diagram of FIG. 6 with F1. In particular in the example shown the selection-discharge step F1 indicates that the programming of the cells contained in the local bit line LBL2$j$ activated by the second select signal YOj and associated with the global bit line GBL2 activated by the access transistor T2 activated. When this discharge has ended, the first decoder 80 sequentially updates the first select signal YNi activating YN3 i.e., enabling for each associated group the corresponding global bit line GBL3.

The operation of the device provides a successive programming step indicated with F2, during which there is, simultaneously for each group, an activation of the second control signal Load_slave which updates the respective Program Load PL on the cell to be programmed of the local bit line LBL3$j$ selected.

The Program Load PL, updated, executes then a pulse programming of the selected cell.

Subsequently, an activation of the update signal update_prgload allows to activate the communication between the output of the multiplexer 41 and each first register LTc1 of each of the plural second portions 71 associated. The transfer of the data to the first register LTc1 is thus allowed, the data being relative to the programming of the cell associated with the global bit line GBL4 successive to the cell being programmed associated with the global bit line GBL3. The data relative to the cells to be programmed are selected and then transferred at the output to the multiplexer 41 by the first address signal ADD_WB generated by the second decoder 81.

Another important advantage is due to the realization of the plural second portions of the logic circuit, each comprising the master-slave circuit that allows both to transfer the data to the program load PL for the programming of an activated cell of an enabled column BLi and to load in sequence the data relative to the programming of a cell belonging to a column BLi enabled subsequently.

A further considerable advantage realized by the present architecture is linked to the reduced memory space necessary for the realization of the plural second portions by means of circuits of the Master-Slave type.

Another embodiment of the present invention further provides a method for programming a non volatile memory device, in particular of the Flash_nor type.

In the following description, referring to previously described parts, the same reference numbers will be maintained for identifying details having the same structure and function.

The memory device comprises a matrix of cells, organized in a plurality of rows WL intersected by a plurality of columns BL.

The device proposed is based on the consideration that the matrix of cells is divided into a plurality of groups of cells to be programmed, substantially adjacent to each other. A group comprises a predetermined number of columns and each column of each group is selected by prearranged select signals generated by a first decoder 80.

In the present embodiment the columns BL are defined by plural global bit-lines GBL each associated with respective local bit-lines LBLj. In particular, in each group the global bit lines are eight GBLi i=0 . . . 7 and each is associated with four local bit lines LBLij j=0 . . . 3.

A first selection step provides to sequentially select, for each group, a global bit line GBLi by means of a first select signal YNi while the local bit lines LBLij are activated by a second select signal YOj, these first and second select signal being generated by a first decoder 80.

At least one program load PL controlled by a logic circuit 70 allows a pulses programming of a cell of the selected column of the group to be programmed associated therewith.

The logic circuit 70 comprising a central portion 72 for the entire matrix and plural second output portions 71 each specific for each Program Load PL. In particular, the central portion 72 and the plural second output portions 71 communicate by means of a bidirectional bus Data_bus.

Advantageously, the method according to an embodiment of the present invention has a discharge step indicated with F1 which provides to activate a discharge signal YNS_DISCH suitable for activating a discharge transistor 34 of a discharge circuit 33 which, connected to a control line Lc, shared by all the columns BL of the group, and a ground reference, allows to eliminate a possible residual voltage present on a column after the pulses programming step.

Advantageously, the method provides a programming step indicated with F2, which provides to update the program load PL for a pulses programming of a cell of the activated column of the group by means of a specific second output portion 71.

Advantageously, moreover, the programming step provides a second update step of the central portion 72 and a third sequential update step of the plural second portions 71.

In particular, the method provides that the second and the third update steps are synchronized.

Simultaneously with the activation of the first address signal ADD_WB there is the activation of the second address signal ADD_ML which sequentially activates the decoder 48 for driving sequentially and simultaneously the corresponding plural second portions 71.

Simultaneously with the activation of the synchronization signal Load_Master in each of the plural second portions 71, the first control signal Comm and the loading of the data in the respective first latch LTc1 are generated, the data being thus ready for their transfer to the second Latch register LTc2 and thus to the program load PL during the successive programming step F2.

It is good to highlight how a device architecture according to an embodiment of the invention allows to activate sequentially a number J of plural second portions 71 where this number J is function of the number of Program Loads PL programmable in series by the logic circuit 70.

The device architecture according to an embodiment of the invention shows several advantages, in particular during a programming step there occurs the transfer of the data relative to the successive programming step with an update simultaneously of the central portion 72 and sequentially of each of the plural second associated portions 71, thus allowing to remarkably speed up the device both due to the advanced presence of the data used for the programming of the successive cell stored on the first latch of each of the plural second portions and due to the capacity of updating these plural second portions in a sequential way.

A further advantage is linked to the presence of the second decoder 81 which allows to manage the decoding of the cells referring to the program load PL, separately from the management of the driving of the multiplexer 41 which occurs by means of the first address signal ADD_WB generated by the first decoder 80. This allows to carry out operations of data transfer on the plural second portions 71 in parallel speeding up the device.

The method then provides the activation, during the second update step, of a first address signal ADD_WB which drives the central portion 72 while during the third update step the method provides the activation of a second address signal ADD_ML which sequentially drives the plural second portions 71.

In particular, the method provides to generate the first and the second address signal ADD_WB and ADD_ML by means of a second decoder 81 independent from the first decoder 80 so as to independently manage the discharge step of the just programmed column with a new programmed step of the selected column.

Advantageously according to a preferred embodiment, the second address signal ADD_ML is a processing of the first address signal ADD_WB.

In particular, each of the plural second portions 71 of the logic circuit 70 comprises a first latch register LTc1 and a second latch register LTc2 connected to each other and activated separately by a first control signal Comm and by a second control signal Load_slave. In particular, the second address signal ADD_WB enabled by a synchronization signal Load_Master generates the first control signal Comm for the control of the first latch register LTc1.

The method advantageously provides to activate the second control signal Load_slave during the programming step, in particular after the discharge step of the preparation step.

Suitably, the method during the programming step provides an enable step which allows to activate the second and the third update step. During the enable step there occurs the activation of an update signal Update_pgmloads which allows the communication, by means of a bus Data_bus, between the central portion 72 and each of the plural second output portions 71.

During the second update step there is the update of the data of the first latch register LTc1 relatively to the cells of a column BLi+1 successive to the selected column BLi which is being programmed.

In particular, the centralized central portion 72 comprises a plurality of latches registers LT associated with each cell of the columns BLi of the group, which store the evolution of the programming of each cell successive to each programming pulses sequence.

The groups of latches comprise a number of latches LT equal to the number of bits present in each cell of the matrix, i.e., if the cells comprise two bits per cell the latches registers LT associated with each cell are two.

The central portion 72 further comprises a multiplexer 41 which receives, at the input, the outputs of the groups of latches Up p=0, . . . , N which, in a sequential way, are brought to an output O1 of the multiplexer 41 as well as to an output of a logic gate 42 controlled by the update signal Update_pgmloads connected to the bus Data_bus.

The method according to an embodiment of the invention comprises, after the programming step of the selected column Bli, a new discharge step F1 of the programmed column BLi, an update of the selected column of the group to be programmed, activating the successive column BLi+1, thus preparing the device for a new programming step F2.

Suitably, the discharge step F1 between two successive programming steps F2 becomes necessary for ensuring the discharge of the just pulsed columns BL as well as for avoiding that undesired spurious pulses are formed during the selection of the active column or Bit-line whereon a new programming step F2 is carried out.

Main advantage of the method according to an embodiment of the invention is that of updating the program load with data being already present in the respective second output portion considerably limiting the path of the high voltage signals inside the device.

Main advantage of the method according to an embodiment of the present invention is linked to the sequential update of the plural second output portions which allows to considerably limit the programming times maintaining the architecture centralized which allows to save area and to locally confine almost all the high voltage signals to the partition limiting the interference between the same.

Another advantage is linked to the synchronization between the second update step of the central portion and the third update step of the plural second output portions thanks to a first and a second address signal generated by a second decoder independent from the first decoder which allows to carry out the steps of first and second selection.

From the foregoing it will be appreciated that, although specific embodiments of the invention have been described herein for purposes of illustration, various modifications may be made without deviating from the spirit and scope of the invention.

What is claimed is:

1. A non-volatile memory comprising:
a matrix of memory cells including rows and columns;
a logic circuit to program selected cells, said circuit including a central portion and a plurality of second output portions, said logic to indicate a first selection of a row and sequentially select successive columns on said selected row;
a discharge circuit to activate a discharge signal, said discharge circuit connected to a column and to ground; and
said logic circuit to pulse program a cell in a selected column and row by means of a specific second output portion to update a program load, a second update for the central portion and a third sequential update of the plurality of second portions.

2. The architecture of claim 1 further comprising a logic gate activated by an update signal which allows the communication between the central portion and the plurality of second portions by means of a bus.

3. The architecture of claim 2 wherein each of the plurality of second portions comprises a first latch register, connected to the bus, and activated by a first control signal and a second latch register in cascade to the first latch connected to the program load and activated by a second control signal.

4. The architecture of claim 3 wherein the central portion comprises a plurality of latch registers, suitable for storing possible switches of the cells of the at least one group of columns, a multiplexer in cascade to the plurality of latch registers with an output connected to the logic gate.

5. The architecture of claim 4 wherein the multiplexer is driven by the first address signal and that the central portion comprises a decoder controlled by the second address signal which drives sequentially the plural second portions.

6. The architecture of claim 5 wherein each of the plural second portions comprises a second logic gate whose inputs are the second address signal output from the decoder and a synchronization signal and whose output is connected to the first Latch register, the output providing the first control signal.

7. The architecture of claim 6 wherein the first address signal and the second address signal are synchronized and activated by means of the synchronization signal.

8. The architecture of claim 1 wherein the plural second portions are sequentially activated and are at the maximum in the number of J and that the number J is function of the number of the Program Loads programmable in series by the logic circuit.

9. A method for programming a non volatile memory device with matrix of memory cells, organized into rows and columns, at least one group of the columns being selected by means of a first decoder, at least one program load controlled by a logic circuit and suitable for programming the cells of an activated column of the at least one group, the logic circuit comprising a central portion centralized for the matrix and plural second output portions each specific for each Program Load, the method comprising the steps of:
  a first selection which provides to select a row of the matrix and in a sequential way the active columns of the group by means of a first enable signal and at least one second select signal generated by the first decoder;
  a discharge step which provides to activate a discharge signal suitable for activating a discharge circuit connected between the columns of the group and a ground reference;
  a programming step which comprises
    a first update step which provides to update the program Load for a pulse programming of one cell of the activated column by means of a specific second output portion;
    a second update step of the central portion and
    a third sequential update step of the plural second portions.

10. The method of claim 9 wherein the second update step and the third update step are synchronized.

11. The method of claim 10 wherein the second update step comprises the activation of a first address signal which drives the central portion while the third update step comprises the activation of a second address signal which sequentially drives the plural second portions.

12. The method of claim 11 wherein the first and second address signal are generated by a second decoder independently from the first decoder.

13. The method of claim 12 wherein the second address signal is a processing of the first address signal.

14. The method of claim 13 wherein the programming step comprises an enable step which allows the activation of the second and the third update step.

15. The method of claim 14 wherein the enable step provides the activation of an update signal which allows to prepare the communication by means of the bus between central portion and each of the plural second portions.

16. The method of claim 15 wherein each of the plural second portions comprises a first and a second latch register connected to each other and activated separately by a first control signal and by a second control signal, the second control signal being activated during the first update step.

17. The method of claim 16 wherein the first and second update steps are activated in parallel to the deactivation of the first update step.

18. The method of claim 17 wherein the synchronization provides to sequentially activate the plural second portions by means of the activation of the second address signal according to a synchronization signal to generate the first control signal.

19. The method of claim 18 wherein the synchronization comprises an update of the central portion by means of the first address signal which drives a multiplexer in cascade to a plurality of latches registers and connected to a logic gate activated by the update signal and connected to the bus.

* * * * *